United States Patent
Yu et al.

(10) Patent No.: US 9,105,552 B2
(45) Date of Patent: *Aug. 11, 2015

(54) PACKAGE ON PACKAGE DEVICES AND METHODS OF PACKAGING SEMICONDUCTOR DIES

(75) Inventors: Chen-Hua Yu, Hsin-Chu (TW); Chien-Hsiun Lee, Chu-tung Town (TW); Chen Yung Ching, Dali (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 374 days.

This patent is subject to a terminal disclaimer.

(21) Appl. No.: 13/483,734

(22) Filed: May 30, 2012

(65) Prior Publication Data

US 2013/0105979 A1    May 2, 2013

Related U.S. Application Data

(60) Provisional application No. 61/553,592, filed on Oct. 31, 2011.

(51) Int. Cl.
*H01L 23/52* (2006.01)
*H01L 23/14* (2006.01)
(Continued)

(52) U.S. Cl.
CPC ........ *H01L 23/147* (2013.01); *H01L 23/49811* (2013.01); *H01L 23/49822* (2013.01); *H01L 23/49827* (2013.01); *H01L 24/97* (2013.01); *H01L 25/105* (2013.01); *H01L 25/50* (2013.01); *H01L 23/525* (2013.01); *H01L 24/06* (2013.01); *H01L 24/13* (2013.01); *H01L 24/16* (2013.01); *H01L 24/32* (2013.01); *H01L 24/48* (2013.01); *H01L 24/73* (2013.01); *H01L 24/78* (2013.01); *H01L 24/81* (2013.01); *H01L 24/92* (2013.01); *H01L 25/0657* (2013.01);
(Continued)

(58) Field of Classification Search
CPC ............. H01L 2225/1058; H01L 2224/48135
USPC .................... 257/778, 775, 779, 780; 438/107
See application file for complete search history.

(56) References Cited

U.S. PATENT DOCUMENTS

| 5,889,326 | A | 3/1999 | Tanaka |
| 6,062,459 | A | 5/2000 | Sabyeying |

(Continued)

FOREIGN PATENT DOCUMENTS

| KR | 20060069502 | 6/2006 |
| KR | 20100075204 | 7/2010 |

OTHER PUBLICATIONS

McCormick, H., et al., "Assembly and Reliability Assessment of Fine Pitch TMV Package on Package (PoP) Components," Proceedings of the SMTA International Conference, San Diego, CA Oct. 4-8, 2009, 8 pages.

(Continued)

*Primary Examiner* — Samuel Gebremariam
(74) *Attorney, Agent, or Firm* — Slater & Matsil, L.L.P.

(57) ABSTRACT

Package on package (PoP) devices and methods of packaging semiconductor dies are disclosed. A PoP device includes a first packaged die and a second packaged die coupled to the first packaged die. Metal stud bumps are disposed between the first packaged die and the second packaged die. The metal stud bumps include a bump region and a tail region coupled to the bump region. The metal stud bumps are embedded in solder joints.

20 Claims, 12 Drawing Sheets

(51) Int. Cl.
    *H01L 25/10* (2006.01)
    *H01L 25/00* (2006.01)
    *H01L 23/498* (2006.01)
    *H01L 23/00* (2006.01)
    *H01L 25/065* (2006.01)
    *H01L 23/525* (2006.01)

(52) U.S. Cl.
    CPC .......... *H01L 2224/0401* (2013.01); *H01L 2224/04042* (2013.01); *H01L 2224/06155* (2013.01); *H01L 2224/131* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2224/78301* (2013.01); *H01L 2224/81815* (2013.01); *H01L 2224/92125* (2013.01); *H01L 2224/97* (2013.01); *H01L 2225/0651* (2013.01); *H01L 2225/06517* (2013.01); *H01L 2225/06558* (2013.01); *H01L 2225/06565* (2013.01); *H01L 2225/1023* (2013.01); *H01L 2225/1058* (2013.01); *H01L 2924/01029* (2013.01); *H01L 2924/10253* (2013.01); *H01L 2924/14* (2013.01); *H01L 2924/1431* (2013.01); *H01L 2924/1434* (2013.01); *H01L 2924/157* (2013.01); *H01L 2924/15311* (2013.01); *H01L 2924/15331* (2013.01); *H01L 2924/15786* (2013.01); *H01L 2924/15788* (2013.01)

(56) References Cited

U.S. PATENT DOCUMENTS

| | | | |
|---|---|---|---|
| 6,872,592 B2 | 3/2005 | D'Amato et al. | |
| 7,246,735 B2 | 7/2007 | Liu et al. | |
| 7,372,151 B1 | 5/2008 | Fan et al. | |
| 7,405,478 B2 | 7/2008 | Ishikawa et al. | |
| 7,476,564 B2 | 1/2009 | Chen et al. | |
| 7,614,538 B2 | 11/2009 | Gillotti et al. | |
| 8,299,595 B2 | 10/2012 | Yoon et al. | |
| 8,525,318 B1 | 9/2013 | Kim et al. | |
| 8,823,180 B2 * | 9/2014 | Wang et al. | 257/775 |
| 2002/0011674 A1 | 1/2002 | Efland et al. | |
| 2002/0117330 A1 | 8/2002 | Eldridge et al. | |
| 2003/0173684 A1 | 9/2003 | Joshi et al. | |
| 2004/0145051 A1 | 7/2004 | Klein et al. | |
| 2005/0067714 A1 | 3/2005 | Rumer et al. | |
| 2005/0087883 A1 | 4/2005 | Hwee et al. | |
| 2005/0199677 A1 | 9/2005 | Sadler et al. | |
| 2006/0055032 A1 * | 3/2006 | Chang et al. | 257/734 |
| 2006/0286828 A1 | 12/2006 | Khandros | |
| 2007/0222053 A1 * | 9/2007 | Wei et al. | 257/686 |
| 2008/0073769 A1 | 3/2008 | Wu et al. | |
| 2008/0258289 A1 | 10/2008 | Pendse et al. | |
| 2010/0133675 A1 * | 6/2010 | Yu et al. | 257/686 |
| 2010/0155920 A1 | 6/2010 | Lee | |
| 2010/0171205 A1 | 7/2010 | Chen et al. | |
| 2010/0224974 A1 | 9/2010 | Shim et al. | |
| 2010/0314739 A1 | 12/2010 | Kaufmann et al. | |
| 2013/0105979 A1 | 5/2013 | Yu et al. | |
| 2013/0168856 A1 | 7/2013 | Wang et al. | |
| 2014/0021605 A1 | 1/2014 | Yu et al. | |

OTHER PUBLICATIONS

Smith, L., "Package-on-package: thinner, faster, denser," Electro IQ® Technology Insights for Electronics Manufacturing, http://www.electroiq.com/articles/sst/print/volume-54/issue-7/features/pop/package-on-package-thinner-faster-denser.html, Solid State Technology, vol. 54, Issue 7, Jul. 12, 2011, pp. 1-6.

* cited by examiner

PACKAGE ON PACKAGE DEVICES AND METHODS OF PACKAGING SEMICONDUCTOR DIES

CROSS-REFERENCE TO RELATED APPLICATIONS

This application claims the benefit of U.S. Provisional Application No. 61/553,592 filed on Oct. 31, 2011, entitled, "Ultra Thin Stacked Packaging Application and Methods of Forming Same," which is incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones. While PoP technology has allowed for a lower package profile, the total thickness reduction is currently limited by the solder ball joint height between the top package and bottom package.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 19:
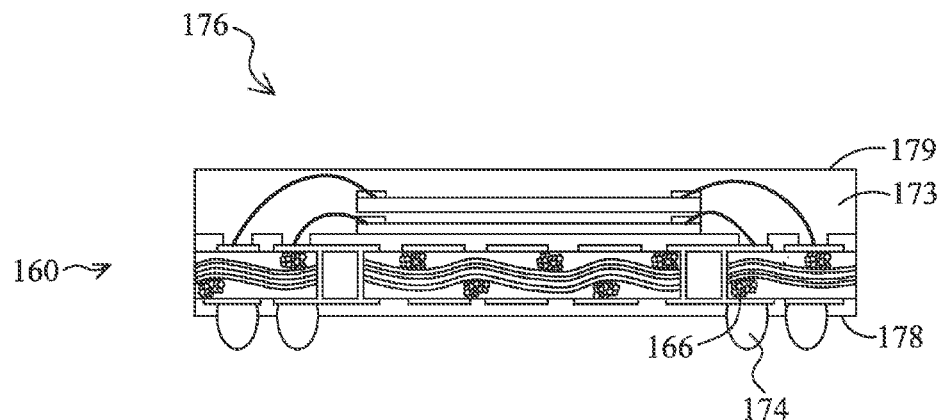
Figure 21:
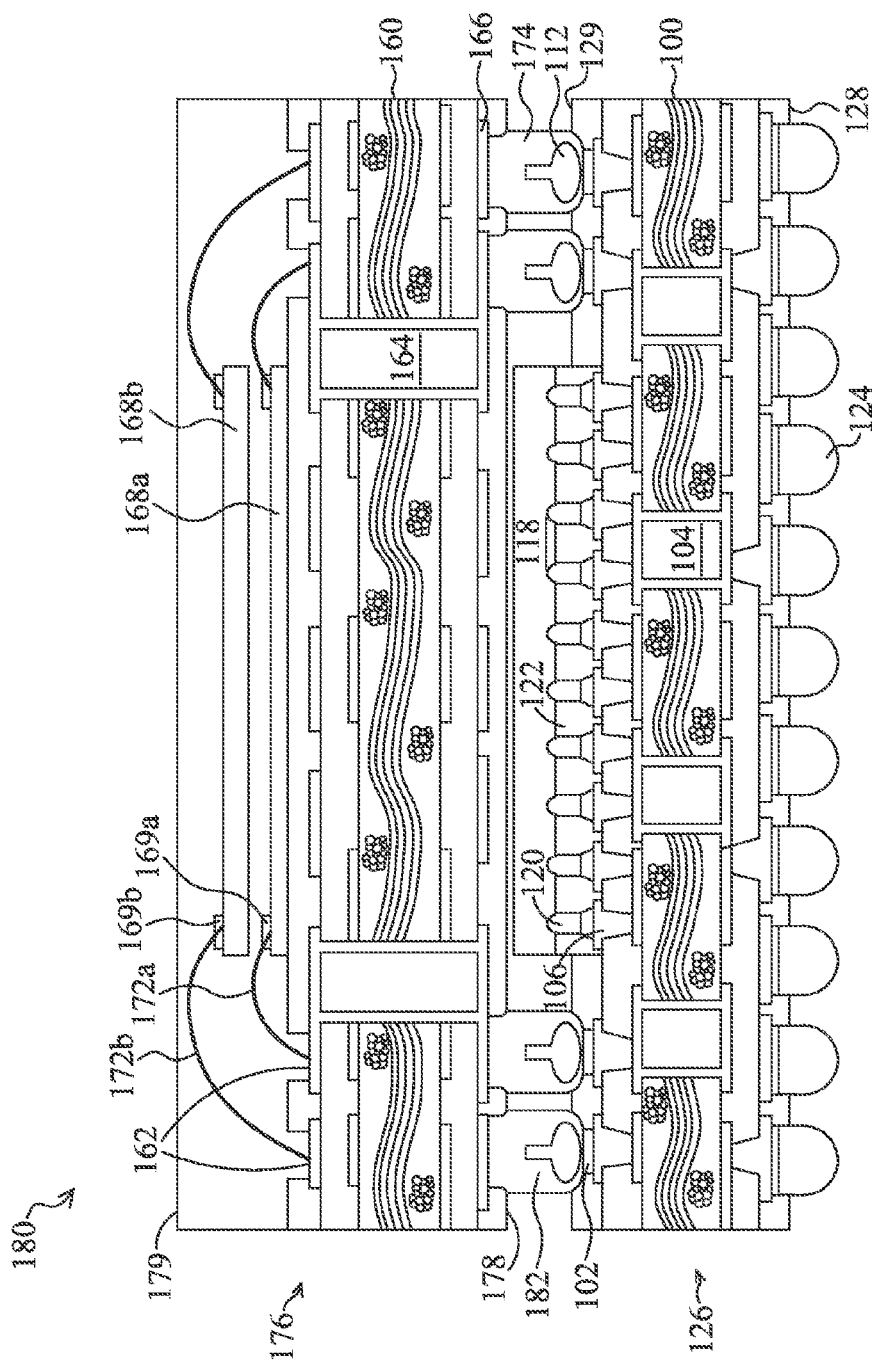
FIG. 21 is a cross-sectional view of a PoP device packaged in accordance with methods described herein.
Figure 22:
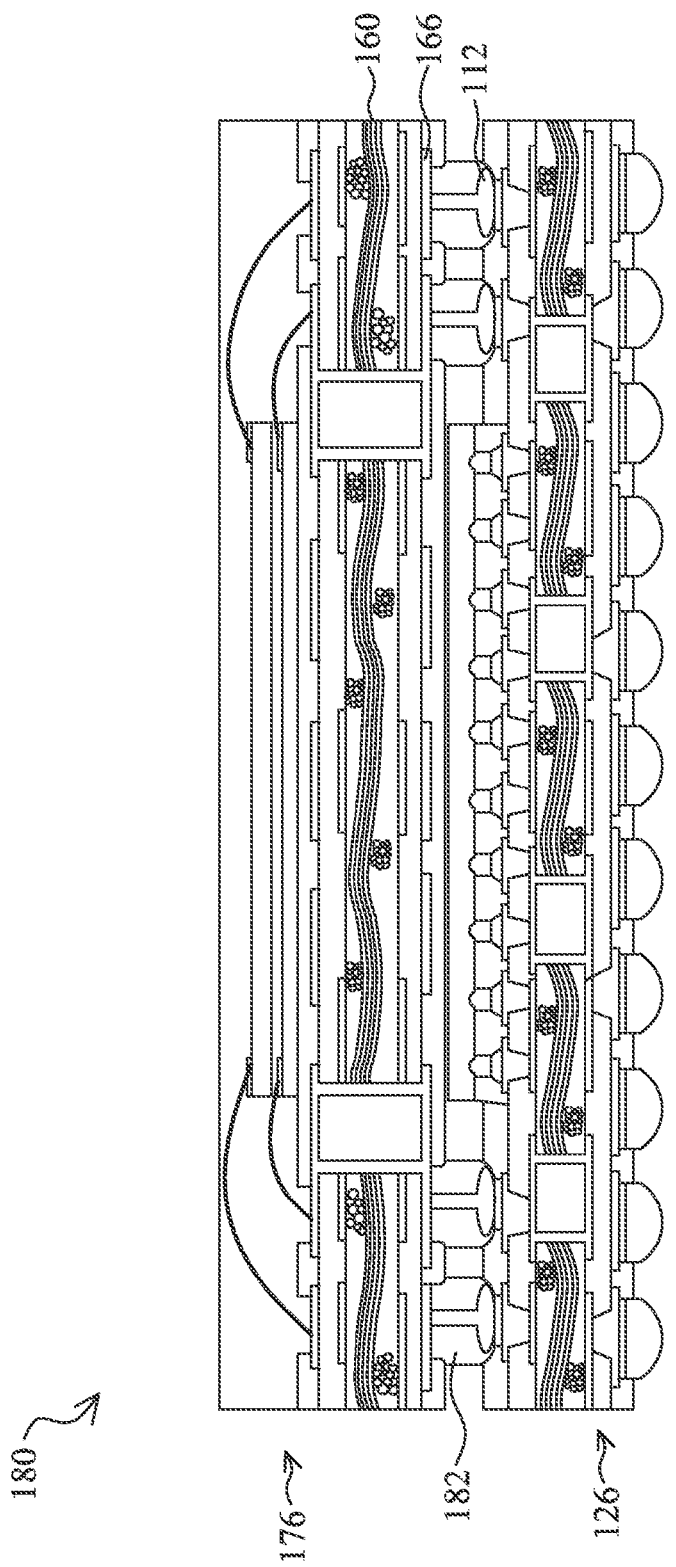
FIG. 22 is a cross-sectional view of a PoP device in accordance with another embodiment.

Embodiments of the present disclosure are related to packaging of semiconductor devices. Novel packaging structures and methods of packaging multiple semiconductor devices in PoP packages will be described herein. A first die 118 is packaged to form a first packaged die 126, shown in FIG. 5, and one or more second dies 168a and 168b are packaged to form a second packaged die 176, as shown in FIG. 19. The second packaged die 176 is packaged with the first packaged die 126, forming a PoP device 180, as shown in FIGS. 21 and 22, to be described further herein. Note that for simplification, not all element numbers are included in each subsequent drawing; rather, the element numbers most pertinent to the description of each drawing are included in each of the drawings.

Figure 1:
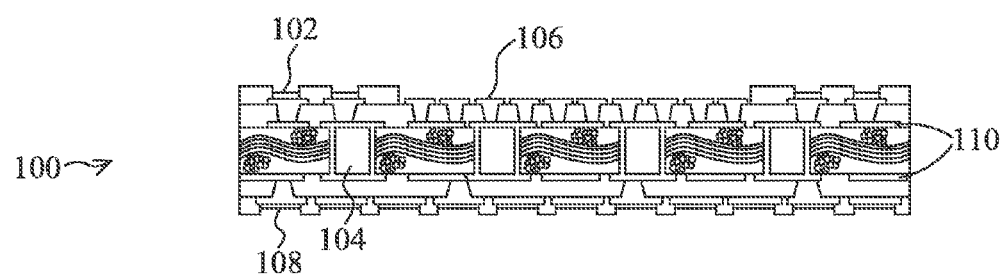
FIGS. 1 through 5 show cross-sectional views of a method of packaging a first die and forming metal stud bumps on a top surface thereof at various stages in accordance with an embodiment of the present disclosure.

FIGS. 1 through 5 show cross-sectional views of a method of packaging the first die 118 and forming metal stud bumps 112 on a top surface thereof at various stages in accordance with an embodiment of the present disclosure. Referring first to FIG. 1, a first substrate 100 is provided. Only one first substrate 100 is shown in the drawings; however, several first substrates 100 are processed on a workpiece comprising a plurality of first substrates 100, and the workpiece is later singulated, after packaging first dies 118 on the first substrates 100.

The first substrate 100 comprises an interposer comprised of an insulating material or glass in some embodiments. In other embodiments, the first substrate 100 comprises a semiconductive material such as a semiconductor wafer. The first substrate 100 may include electronic components and elements formed thereon in some embodiments, or alternatively, the first substrate 100 may be free of electronic components and elements.

Bond pads 102 are formed on the top surface of the first substrate 100, in a peripheral region (not shown in FIG. 1: see peripheral region 146 in FIG. 10) of the first substrate 100 in a top view. Bond pads and/or traces 106 are formed on the top surface of the first substrate 100 in a central region (also not shown in FIG. 1: see central region 148 in FIG. 13) of the first substrate 100 in a top view. Bond pads 108 are formed on the bottom surface of the first substrate 100. The bond pads 108 may be arranged in an array or in rows or columns on the bottom surface of the first substrate 100, not shown. The bond pads 108 may fully populate the bottom surface or may be arranged in various patterns, such as patterns used in ball grid array (BGA) or land grid array (LGA) package devices, as examples. The bond pads 102, bond pads and/or traces 106, and bond pads 108 comprise a conductive material such as Al, Cu, Au, alloys thereof, other materials, or combinations and/ or multiple layers thereof, as examples. Alternatively, the bond pads 102, bond pads and/or traces 106, and bond pads 108 may comprise other materials.

The first substrate 100 includes a plurality of through-substrate vias (TSVs) 104 formed therein in some embodiments. The TSVs 104 comprise conductive or semiconductive material that extends completely through the first substrate 100 may optionally be lined with an insulating material. The TSVs 104 provide vertical electrical connections (e.g., y-axis connections in FIG. 1) from a bottom surface to a top surface of the first substrate 100.

The first substrate 100 includes wiring 110 formed within one or more insulating material layers. The wiring 110 provides horizontal electrical connections (e.g., x-axis connections in the view shown in FIG. 1) in some embodiments, for example. The wiring 110 may include fan-out regions that include traces of conductive material for expanding the footprint of a first die (not shown in FIG. 1: see first die 118 in FIG. 3) to a footprint of the bottom side of the first substrate 100, e.g., of the bond pads 108. The wiring 110 of the first substrate 100 may include one or more redistribution layers (RDLs). The RDLs may comprise one or more insulating layers and wiring layers. The RDLs may include inter-level dielectrics (ILDs) with wiring in metallization layers disposed or formed therein. The wiring 110 may comprise one or more vias and/or conductive lines, for example. The wiring 110 and the TSVs 104 may be formed using one or more subtractive etch processes, single damascene techniques, and/or dual damascene techniques, as examples. A portion of the wiring 110 may reside on the top and bottom surfaces of the first substrate 100; e.g., portions of the wiring 110 of the first substrate 100 may comprise bond pads 102, bond pads and/or traces 106, and bond pads 108 that are coupleable to other elements. Alternatively, the bond pads 102, bond pads and/or traces 106, and bond pads 108 may be formed separately and attached to portions of the wiring 110, in other embodiments.

Figure 2:
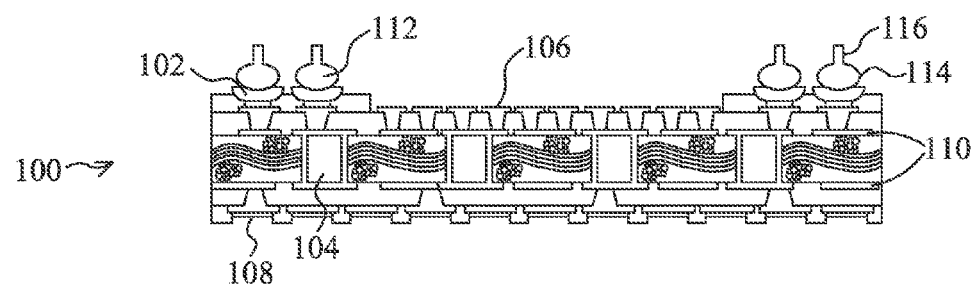

In accordance with embodiments of the present disclosure, a plurality of metal stud bumps 112 is attached to the bond pads 102 on the top surface of the substrate 100, as shown in FIG. 2. The plurality of metal stud bumps 112 may be attached using a method similar to a wire-bond method, e.g., using a wire bonder (not shown). The metal stud bumps 112 include a bump region 114 and a tail region 116 coupled to the bump region 114. The bump region 114 comprises a flattened ball shape, and the tail region 116 comprises a tail or stud shape.

The plurality of metal stud bumps 112 comprises a conductive material, such as a metal. In some embodiments, the plurality of metal stud bumps 112 comprises Cu, Al, Au, Pt, Pd, and/or combinations thereof, for example. Alternatively, the metal stud bumps 112 may comprise other conductive materials and/or metals. Each of the plurality of metal stud bumps 112 comprises a height of about 50 to 300 µm and a diameter of about 50 to 200 µm proximate the first substrate 100, in some embodiments. Alternatively, plurality of metal stud bumps 112 may comprise other materials and dimensions. The formation of the metal stud bumps 112 and the dimensions thereof will be described further herein with reference to FIGS. 6 through 8 and FIG. 9, respectively.

Figure 3:
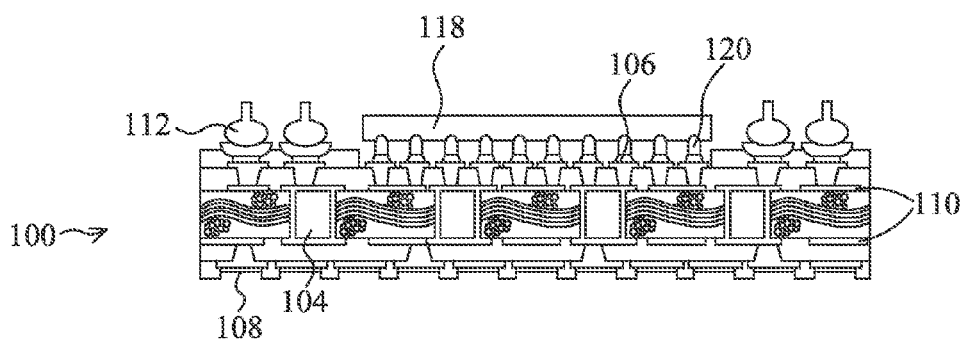

Next, a first die 118 is provided and is attached to the first substrate 100, as shown in FIG. 3. The first die 118 comprises an integrated circuit or chip that will be packaged with a second die 168a and optionally also a third die 168b in a single PoP device 180 (see FIG. 21). The first die 118 may include a workpiece that includes a semiconductor substrate comprising silicon or other semiconductor materials and may be covered by an insulating layer, for example. The first die 118 may include one or more components and/or circuits formed in and/or over the workpiece, not shown. The first die 118 may include conductive layers and/or semiconductor elements, e.g., transistors, diodes, capacitors, etc., also not shown. The first die 118 may comprise logic circuitry, memory devices, or other types of circuits, as examples. The first die 118 may include a plurality of contacts (not shown) formed on a bottom surface thereof.

A plurality of solder bumps 120 is formed on the bottom surface of the first die 118, e.g., on the plurality of contacts on the bottom surface of the first die 118. The solder bumps 120 may comprise microbumps or solder balls, as examples. The solder bumps on the first die 118 are then attached to the bond pads and/or traces 106 on the top surface of the first substrate 100, as shown in FIG. 3. A solder reflow process is used to reflow the solder of the solder bumps 120 and attach the first die 118 to the first substrate 100, electrically and mechanically attaching the solder bumps 120 to the bond pads or traces 106 of the first substrate 100, for example. The solder bumps 120 may alternatively be attached to the first substrate 100 using other methods.

In some embodiments, the first die 118 is attached to the first substrate 100 using a flip-chip bond-on-trace (BOT) attachment technique. Alternatively, other flip-chip attachment techniques and other types of bond pads 106 may be used.

Figure 4:
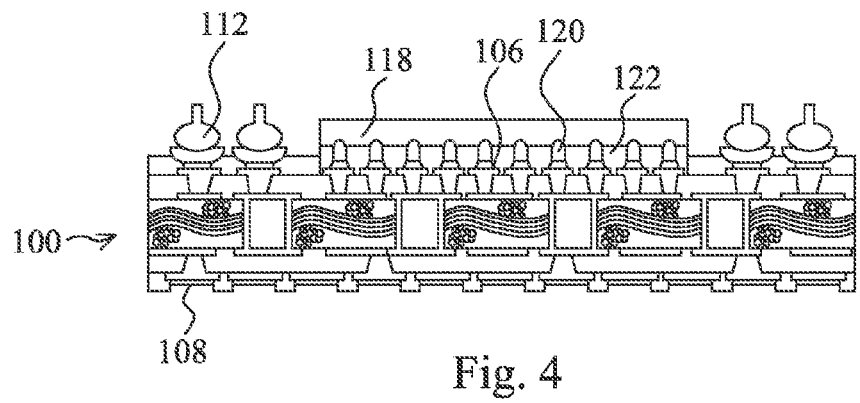

An underfill material 122 is then applied under the first die 118, between the first substrate 100 and the first die 118, as shown in FIG. 4. The underfill material 122 is applied using a dispensing needle along one or more edges of the first die 118, for example, although other methods may also be used to form the underfill material 122. The underfill material 122 comprises epoxy or a polymer in some embodiments, although other materials may alternatively be used.

Figure 5:
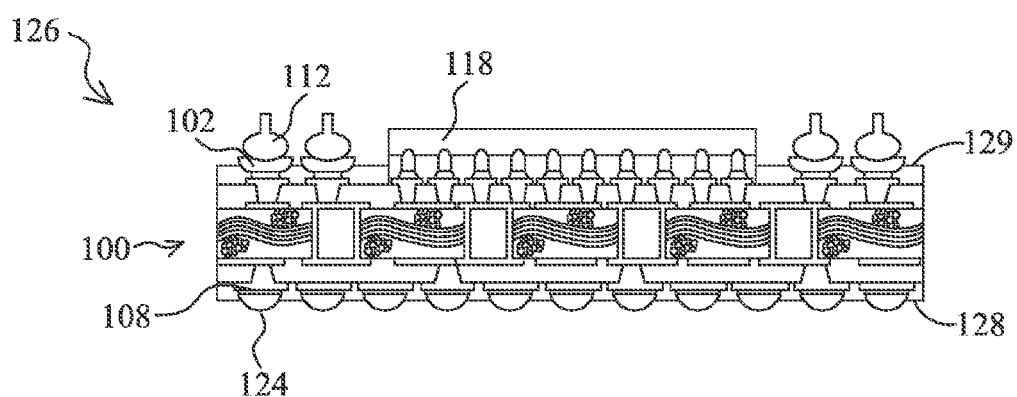

A plurality of solder balls 124 is then formed on the bottom surface of the first substrate 100, as shown in FIG. 5. The solder balls 124 are attached to the bond pads 108 on the bottom of the first substrate 100. The solder balls 124 may be formed using a ball mount process, followed by a solder reflow process, for example. The solder balls 124 may alternatively be formed using other methods.

The first substrate 100 is then singulated from other first substrates 100 on the workpiece, forming a first packaged die 126. The first packaged die 126 is also referred to herein as a bottom packaged die, for example. The bottom packaged die 126 comprises a plurality of bond pads 102 on the top surface 129 thereof, and includes a plurality of solder balls 124 formed on bond pads 108 on the bottom surface 128 thereof. Each of the plurality of metal stud bumps 112 is bonded to a bond pad 102 on the top surface 129 of the bottom packaged die 126. Final tests are then performed on the first or bottom packaged die 126.

Figure 6:
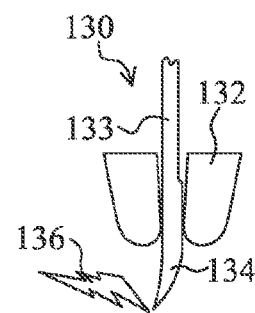
FIGS. 6 through 8 illustrate cross-sectional views of an example of a method of forming the metal stud bumps.
Figure 7:
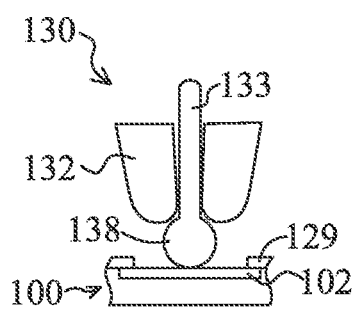
Figure 8:
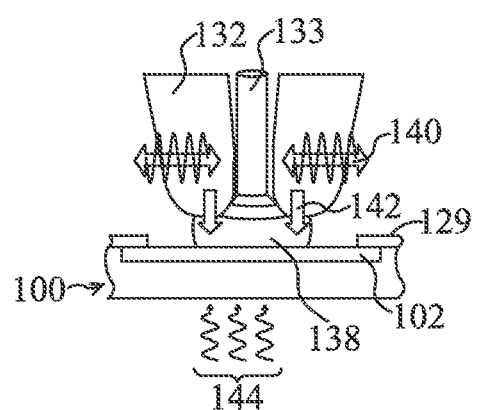

FIGS. 6 through 8 illustrate cross-sectional views of an example of a method of forming the metal stud bumps 112 shown in FIGS. 2 through 5. The metal stud bumps 112 are formed using a wire bonder that includes a capillary 132 for dispensing a metal wire 133, an electric flame off (EFO)

wand, and a transducer (the wire bonder and some elements thereof are not shown in the figures). A portion 130 of the wire bonder is shown in FIG. 6 with a wire 133 disposed inside a capillary 132. The capillary 132 is adapted to control and move the wire during the bonding process. The wire 133 comprises Cu, Al, Au, Pt, Pd, and/or combinations thereof, for example. Alternatively, the wire 133 may comprise other conductive materials and/or metals.

An end 134 of the wire 133 protrudes from the tip of the capillary 132. The EFO wand is used to create an electrical spark 136 proximate the end 134 of the wire 133, which forms a ball 138 at the end 134 of the wire 133, as shown in FIG. 7. The ball 138 is formed using a free air ball (FAB) technique. The ball 138 is placed against a bond pad 102 on the first substrate 100, also shown in FIG. 7.

The capillary 132 vibrates the ball 138 in a horizontal direction in the view shown in FIG. 8, using ultrasonic vibration or power 140. A force 142 is applied against the bond pad 102, and heat 144 is applied to the first substrate 100, also shown in FIG. 8, attaching the ball 138 on the wire 133 to the bond pad 102. The capillary 132 is then removed, simultaneously breaking the wire 133 and forming a tail region 116 having a predetermined length (not shown in FIG. 8: see FIG. 9), leaving a metal stud bump 112 attached or bonded to the first substrate 100 on top of the bond pad 102, as shown in a cross-sectional view in FIG. 9. Alternatively, the metal stud bumps 112 may be formed and bonded to the first substrate 100 using other methods.

Figure 9:
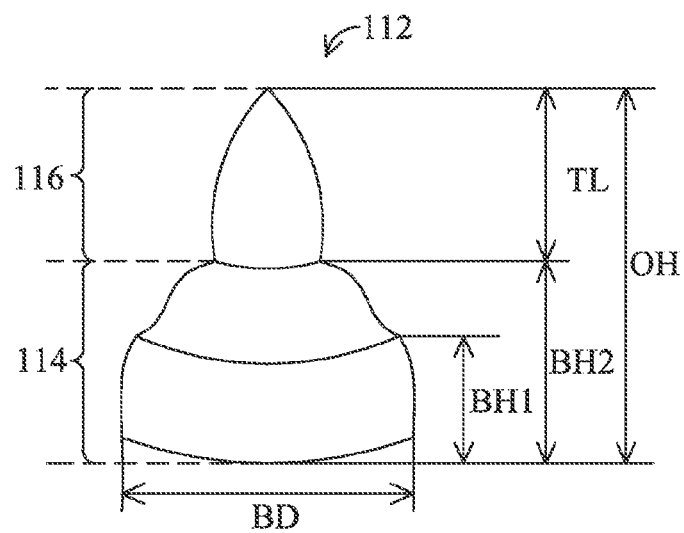
FIG. 9 is a cross-sectional view of a metal stud bump, illustrating dimensions of portions of the metal stud bump in accordance with an embodiment.

FIG. 9 also illustrates dimensions of portions of the metal stud bump 112 in accordance with an embodiment. The metal stud bump 112 has a bump diameter BD proximate the first substrate 100, a ball height BH1, a base height BH2 of the bump region 114, a tail length TL of the tail region 116, and an overall height OH, as shown. The dimensions BD, BH1, BH2, TL, and OH vary according to the diameter of the wire 133, which may range from about 1 to 2 mm in some embodiments, for example. BD ranges from about 50 to 200 µm; TL ranges from about 10 to 200 µm; OH ranges from about 50 to 300 µm; and BH1 and BH2 are less than OH in some embodiments, as examples. In one embodiment, the overall height OH ranges from about 50 to 300 µm and the bump diameter BD proximate the first substrate 100 ranges from about 50 to 200 µm. In another embodiment, the overall height OH comprises about 300 µm. In some embodiments, the ratio of overall height OH to bump diameter BD is greater than about 1 to about 6, as another example. Alternatively, the wire 133 and the metal stud bumps 112 may comprise other dimensions.

Figure 10:
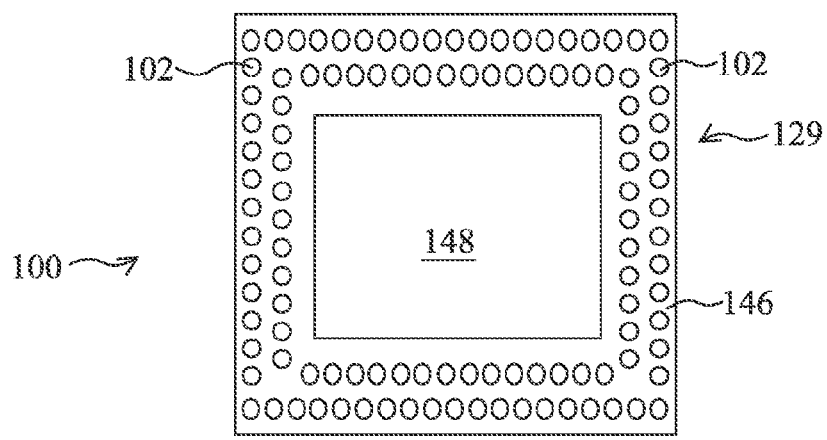
FIGS. 10 through 12 are top views of a substrate of a first packaged die, illustrating regions on a substrate where the metal stud bumps are formed in accordance with embodiments.
Figure 11:
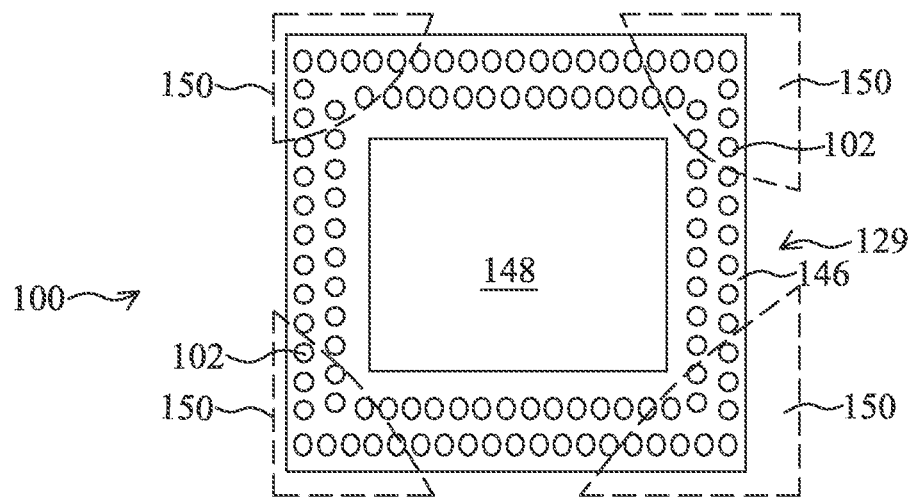
Figure 12:
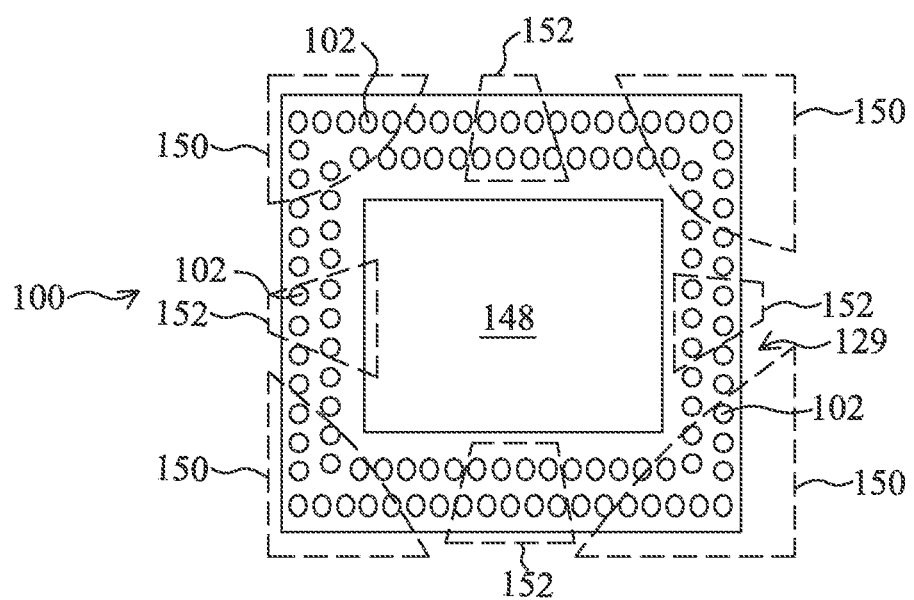

FIGS. 10 through 12 are top views of a first substrate 100 of a first packaged die 126 that illustrate regions on the first substrate 100 where the novel metal stud bumps 112 are formed in accordance with embodiments. The first substrate 100 has a peripheral region 146 disposed about a central region 148, as shown. The peripheral region 146 may comprise a plurality of bond pads 102 formed therein in one or more rows. As an example, two rows of bond pads 102 are shown in the peripheral region 146 in FIGS. 10 through 12; alternatively, other numbers of rows may be used. The central region 148 includes a plurality of bond pads and/or traces 106 (not shown in FIGS. 10 through 12: see FIG. 13).

In one embodiment, the metal stud bumps 112 are coupled to each of the bond pads 102 in the peripheral region 146, as shown in FIG. 10. One of the plurality of metal stud bumps 112 is bonded to each of the plurality of bond pads 102 on the bottom packaged die 126, e.g., in the peripheral region 146.

In other embodiments, one of the plurality of metal stud bumps 112 is bonded to only some of the plurality of bond pads 102 on the bottom packaged die 126. For example, FIG. 11 shows an embodiment wherein the metal stud bumps 112 are coupled to each of the bond pads 102 in the corner regions 150 (e.g., in the peripheral region 146) of the first substrate 100. One of the plurality of metal stud bumps 112 is bonded to each of the plurality of bond pads 102 in the corner regions 150 of the bottom packaged die 126. At least 10% of the bond pads 102 on the first substrate 100 in the peripheral region 146 have a metal stud bump 112 coupled thereto in some embodiments.

In yet another embodiment, the metal stud bumps 112 are coupled to the bond pads 102 in the corner regions 150, and also to central edge regions 152, as shown in FIG. 12, e.g., in the peripheral region 146. One of the plurality of metal stud bumps 112 is bonded to each of the plurality of bond pads in the central edge regions 152 and also in corner regions 150 of the bottom packaged die 126.

Note that the metal stud bumps 112 are not shown in FIGS. 10 to 12; the bond pads 102 that the metal stud bumps 112 are attached to are visible in the views shown. The numbers of bond pads 102 in the central edge regions 152 and the corner regions 150 shown are exemplary and may vary based on the semiconductor device design, for example.

Figure 13:
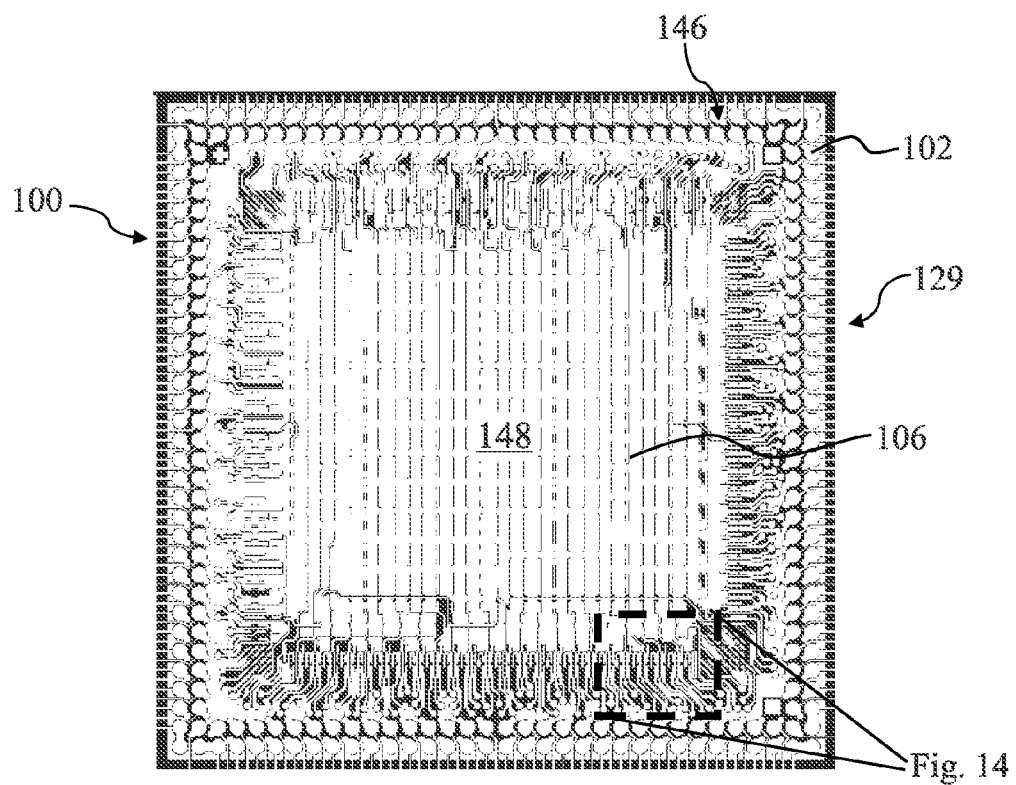
FIG. 13 shows a more detailed top view of a substrate of a first packaged die.
Figure 14:
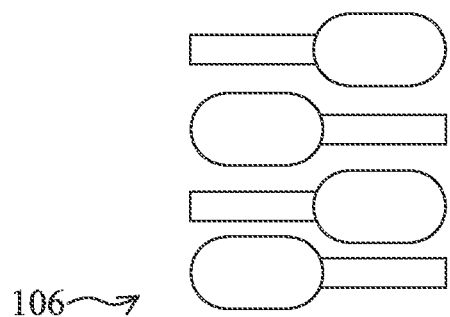
FIG. 14 shows a more detailed view of a portion of the substrate shown in FIG. 13, illustrating bump-on-trace patterns that are used to attach a die to the substrate in an embodiment.

FIG. 13 shows a more detailed top view of a first substrate 100 of a first packaged die 126. The bond pads and/or traces 106 are shown, which are formed in the central region 106 of the first substrate 100. A more detailed view of a portion of FIG. 13 is shown in FIG. 14, illustrating bump-on-trace patterns that are used to attach a die to the substrate in an embodiment, wherein the first die 118 is packaged using a BOT packaging technique. Alternatively, the patterns of the bond pads 106 may comprise patterns typically used for solder balls, in other embodiments.

Figure 15:
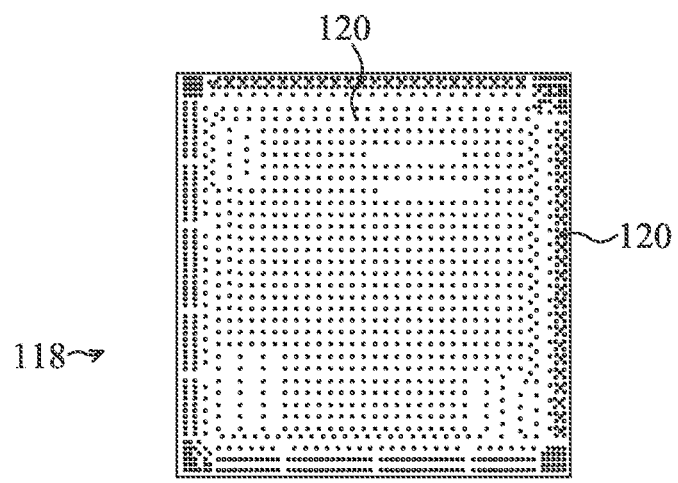
FIG. 15 shows a bottom view of a die, illustrating a pattern of solder bump contacts in accordance with an embodiment.

FIG. 15 shows a bottom view of a first die 118, illustrating a pattern of solder bumps 120 in accordance with an embodiment. The solder bumps 120 may be more densely populated in perimeter and/or corner regions, and may have gaps where no solder bumps 120 are formed in certain portions thereof. The pattern shown in FIG. 15 is merely an example: many other types of patterns may also be used for the solder bumps 120, depending on the semiconductor device design.

FIGS. 16 through 19 show cross-sectional views of a method of packaging at least one second die 168a at various stages in accordance with an embodiment. A second substrate 160 is provided, which may comprise a substrate similar to the first substrate 100 described herein and which may comprise similar materials and components. The second substrate 160 may comprise a plurality of second substrates 160 formed on a strip (not shown), e.g., a strip including about 4 blocks of 4 rows and 3 columns of second substrates 160. Alternatively, other numbers of second substrates 160 may be formed on a strip of substrates, in other arrangements. The second substrate 160 may include TSVs 164 and wiring 170 similar to the TSVs 104 and wiring 110 described for the first substrate 100. The second substrate 160 includes contact pads 162 on the top surface in a perimeter region and contacts 166 on the bottom surface. The contact pads 162 and contacts 166 may comprise similar materials described for the bond pads 102, bond pads or traces 106, and bond pads 108 of the first substrate 100, for example.

Figure 16:
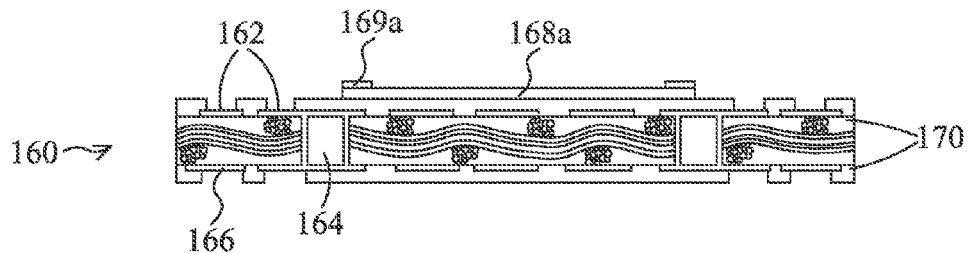
FIGS. 16 through 19 show cross-sectional views of a method of packaging at least one second die at various stages in accordance with an embodiment.
Figure 17:
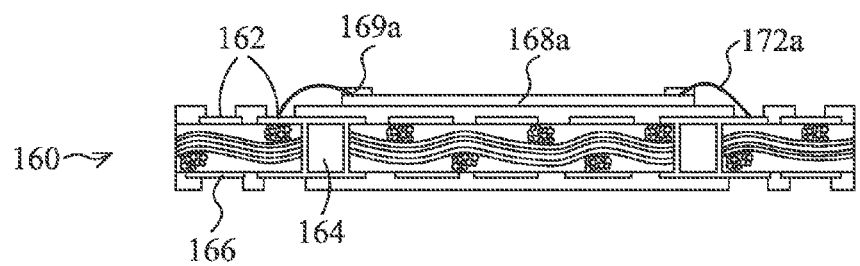

A second die 168a is provided, as shown in FIG. 16. The second die 168a may comprise a die similar to that described for the first die 118, for example. At least one second die 168a is attached to the top surface of the second substrate 160. The second die 168a includes a plurality of contacts 169a on a top surface thereof in a perimeter region. The second die 168a is attached to the top surface of the second substrate 160 using a glue or adhesive, not shown. The second die 168*a* is then electrically connected to the second substrate 160 using wire bonds 172*a* along two or more edges of the second die 168*a*. The second die 168*a* may be wire bonded along all four edges to the second substrate 160, for example. Coupling the second die 168*a* to the top surface of the second substrate 160 comprises wire-bonding contacts 169*a* on a top surface of the second die 168*a* to contact pads 162 on the top surface of the second substrate 160 using the wire bonds 172*a*.

Figure 18:
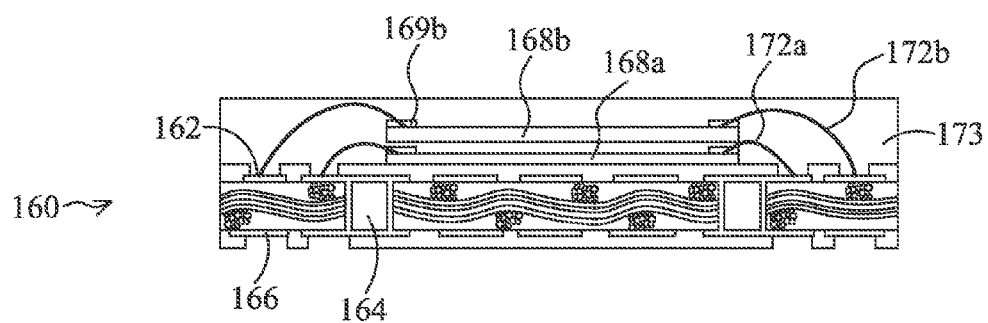

In some embodiments, one second die 168*a* is coupled to the second substrate 160, and then a molding compound 173 is formed over the second die 168*a* and top surface of the second substrate 160, not shown in the drawings. In other embodiments, two second dies 168*a* and 168*b* are coupled over the second substrate 160, as shown in FIG. 18. A plurality of second dies 168*a* and 168*b* are stacked vertically above the second substrate 160, for example.

The second die 168*b* is also referred to herein as a third die. The third die 168*b* is coupled over the second die 168*a*, e.g., attached to the top surface of the second die 168*a* using a glue or adhesive, as shown in FIG. 18. Contacts 169*b* on a top surface of the third die 168*b* are wire bonded using wire bonds 172*b* to contact pads 162 on the top surface of the second substrate 160, also shown in FIG. 18. The third die 168*b* is wire bonded to the second substrate 160 similar to the wire bonding of the second die 168*a* to the second substrate 160 described herein, for example. Two or more rows of contact pads 162 may be formed on the top surface of the second substrate 160. The inner-most row of contact pads 162 is wire bonded to the second die 168*a*, and the outer-most row of contact pads 162 is wire bonded to the third die 168*b*, as shown in FIG. 18. A molding compound 173 is formed over the third die 168*b* and exposed portions of the second substrate 160. The molding compound 173 comprises an insulating material that protects the wire bonds 172*a* and 172*b*, for example.

In some embodiments, the second dies 168*a* and 168*b* are packaged on the second substrate 160 using a flip-chip wafer level packaging (WLP) technique and wire bonding process, for example. Alternatively, the second dies 168*a* and 168*b* may be packaged on the second substrate 160 using other types of packaging processes.

In some embodiments, the second substrate 160 may not include an RDL in the wiring 170. All or some of the x-axis or horizontal electrical connections may be made using wire bonds 172*a* and 172*b*, in these embodiments. In other embodiments, the second substrate 160 may include an RDL in the wiring 170, as another example. All or some of the x-axis or horizontal electrical connections may be made in the RDL in these embodiments.

After the molding compound 173 is applied, a plurality of solder balls 174 is formed on the bottom surface of the second substrate 160, e.g., the solder balls 174 are coupled to the contacts 166, as shown in FIG. 19, and as described for the solder balls 124 on the bottom surface of the first substrate 100, as shown in FIG. 5. The second substrate 160 is then singulated from other second substrates 160 on a workpiece (e.g., comprising a strip of second substrates 160) the second substrate 160 was fabricated on, forming a second packaged die 176. The second packaged die 176 is also referred to herein as a top packaged die, for example. The top packaged die 176 includes the molding compound 173 at the top surface 179 thereof, and includes the solder balls 174 coupled to the contacts 166 at the bottom surface 178 thereof. Final tests are performed on the second packaged die 176.

Figure 20:
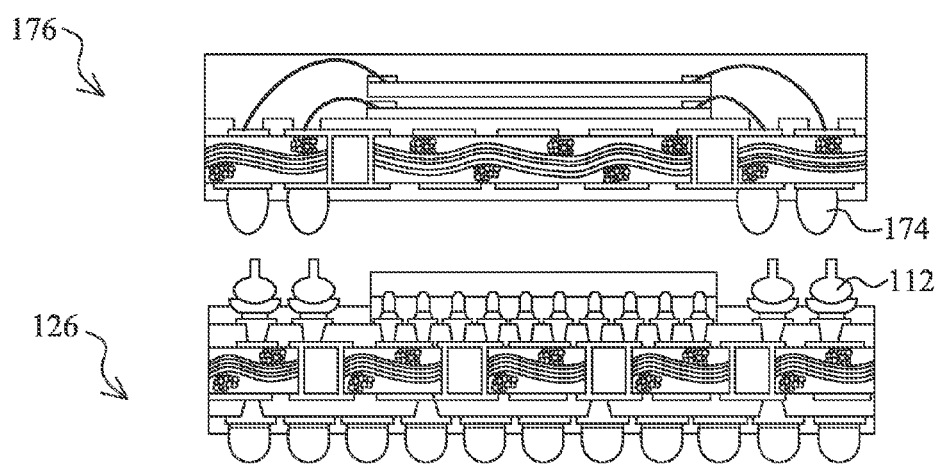
FIG. 20 illustrates a cross-sectional view of attaching the second packaged die to a first packaged die in accordance with an embodiment.

FIG. 20 illustrates a cross-sectional view of attaching the second packaged die 176 to a first packaged die 126 in accordance with an embodiment. The second packaged die 176 is lowered until the solder balls 174 are coupled to the metal stud bumps 112, and the solder balls 174 are reflowed, so that a solder joint 182 is formed over each of the metal stud bumps 112, as shown in FIG. 21, which is a cross-sectional view of a PoP device 180 packaged in accordance with methods described herein. The solder joints 182 have a substantially barrel shape in the cross-sectional view. Each of the plurality of metal stud bumps 112 is embedded in a solder joint 182. The plurality of metal stud bumps 112 is disposed between the first packaged die 126 and the second packaged die 176, as shown, for example. The solder joints 182 electrically couple together the bond pads 102 of the first packaged die 126 and the contacts 166 of the second packaged die 126, and also mechanically couple together the first and second packaged dies 126 and 176.

The solder joints 182 are formed in some embodiments by heating the first substrate 100 and the second substrate 160 to reflow a solder material of the plurality of solder balls 174 on the bottom surface 178 of the second substrate 160 and form the plurality of solder joints 182 between the first substrate 100 and the second substrate 160. At least some of the plurality of solder joints 182 include one of the plurality of metal stud bumps 112. One illustrative process might include heating the first substrate 100 with the metal stud bumps 112 formed thereon (on a bottom packaged die 126) to above the solder melting point, which is about +10° C.; aligning a solder ball 174 (on a top packaged die 176); and placing it on top of the metal stud bump 112 to form a temporary joint, and following with a process to form a permanent solder joint 182, for example.

Each of the plurality of solder balls 174 (which become part of the solder joint 182 after the solder reflow process) on the top packaged die 176 is coupled to a contact 166 on a bottom surface of the top packaged die 176, and each of the plurality of metal stud bumps 112 extends partially to a contact 166 on the top packaged die 176 within the solder joints 182. The metal stud bumps 112 do not extend fully to the contacts 166 of the top packaged die 176 in the embodiment shown in FIG. 21.

Alternatively, the metal stud bumps 112 may extend fully to the contacts 166 of the top package die 176, as shown in FIG. 22, which is a cross-sectional view of a PoP device 180 in accordance with another embodiment. Advantageously, because the metal stud bumps 112 comprise a low overall height OH (see FIG. 9), the first and second packaged dies 126 and 176 may be placed more closely together, decreasing the thickness of the PoP device 180. PoP device 180 total thicknesses of about 0.5 to about 1.5 mm are achievable using the novel embodiments of the present disclosure described herein, for example. Alternatively, the PoP device 180 thicknesses may comprise other dimensions. PoP device 180 thicknesses may be decreased by about 10% or greater by the use of embodiments of the present disclosure. In some applications, the PoP device 180 standoff height may be reduced by about 40% or greater, e.g., from about 280 μm to about 150 μm, as another example.

Figure 23:
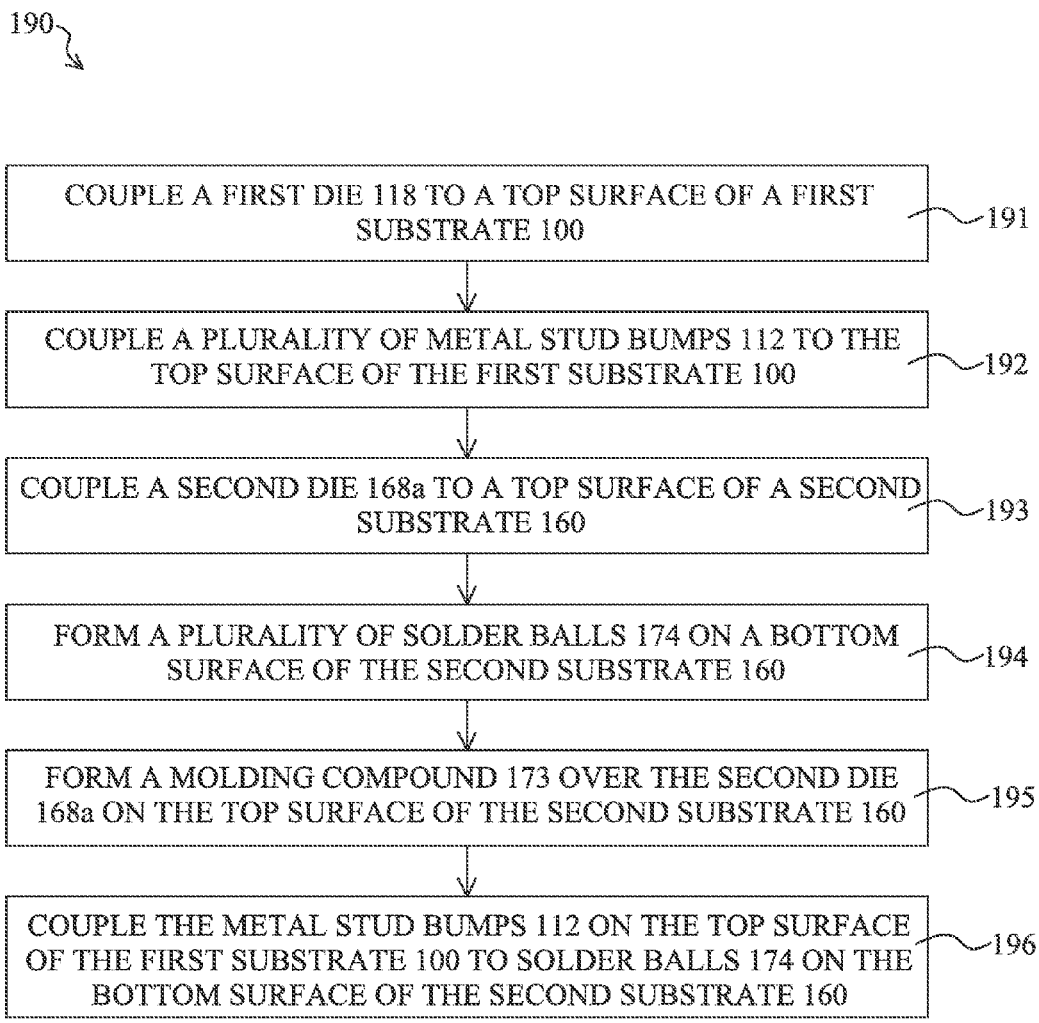
FIG. 23 is a flow chart illustrating a method of packaging semiconductor dies in accordance with an embodiment of the present disclosure.

FIG. 23 is a flow chart 190 illustrating a method of packaging semiconductor devices (i.e., first dies 118, second dies 168*a*, and optionally also third dies 168*b*) in accordance with an embodiment of the present disclosure. In step 191, a first die 118 is coupled to a top surface of a first substrate 100. In step 192, a plurality of metal stud bumps 112 is coupled to the top surface of the first substrate 100. In step 193, a second die 168*a* is coupled to a top surface of a second substrate 160. In step 194, a plurality of solder balls 174 is formed on a bottom surface of the second substrate 160. In step 195, a molding compound 173 is formed over the second die 168a (and also over the third die 168b, if included) on the top surface of the second substrate 160. In step 196, each of the plurality of metal stud bumps 112 on the top surface of the first substrate 100 is coupled to one of the plurality of solder balls 174 on the bottom surface of the second substrate 160.

In some embodiments, the second dies 168a and 168b comprise memory devices such as random access memories (RAM) or other types of memory devices, and the first die 118 comprises a logic device. Alternatively, the second dies 168a and 168b and the first die 118 may comprise other functional circuitry. A different method may be used to attach the second dies 168a and 168b to the second substrate 160 than is used to attach the first die 118 to the first substrate 100, as shown in the drawings. Alternatively, the same method may be used to attach the first die 118 to the first substrate 100 that is used to attach the second dies 168a and 168b to the second substrate 160.

In some embodiments, the second dies 168a and 168b are packaged using a flip-chip WLP technique and wire bonding, and the first die 118 is packaged using a flip-chip and BOT technique, as an example. Alternatively, the second dies 168a and 168b and the first die 118 may be packaged using other methods or techniques.

Embodiments of the present disclosure include methods of packaging multiple semiconductor devices (e.g., first dies 118, second dies 168a, and optionally also third dies 168b) in a single PoP device 180 using metal stud bumps 112 in the electrical connections (e.g., the solder joints 182) between the first packaged dies 126 and the second packaged dies 176. Embodiments of the present disclosure also include PoP devices 180 that include the novel metal stud bumps 112 described herein.

Advantages of embodiments of the disclosure include providing novel metal stud bumps 112 that reduce the distance between first and second packaged dies 126 and 176 in PoP devices 180, and thus also reduce the overall thickness of the PoP devices 180 that include the metal stud bumps 112. The metal stud bump 112 overall height OH and width (diameter) is very small, thus reducing the amount of solder that is required to be used for the solder balls 174. The small OH of the metal stud bumps 112 forms a low profile of solder around the metal stud bumps 112 after the solder reflow process of the solder balls 174, reducing the standoff height between the first and second packaged dies 126 and 176, thus also reducing the PoP device 180 thickness. The innovative structures described herein advantageously produce ultra-thin stacked packages and packaging techniques for semiconductor devices.

Furthermore, because the diameter, e.g., the bump diameter BD, of the bump portion 114 of the metal stud bumps 112 is very small, the pitch of the contacts 166 on the bottom surface of the top packaged die 176 and the pitch of the bond pads 102 on the top surface of the bottom packaged die 126 may be reduced, resulting in a smaller width in a top view for the packaged dies 126 and 176 and also the PoP device 180. PoP devices 180 having a body size with a width of about 14 mm×14 mm or less in a top view are achievable using embodiments of the present disclosure, for example.

The metal stud bumps 112 described herein may be produced with low costs, providing a cost savings in the packaging process. The presence of the metal stud bumps 112 in the solder joints 182 facilitate in the prevention of bridging of adjacent solder joints 182 in some embodiments, reducing or preventing shorts and improving device yields. The novel PoP structures and designs described herein are easily implementable in semiconductor device packaging process flows. Embodiments of the present disclosure are particularly advantageous for use in end applications that require low profile packages, such as handheld products, for example.

In embodiments wherein one of the plurality of metal stud bumps 112 is bonded to only some of the plurality of bond pads 102 on the bottom packaged die 126, the other bond pads 102 not having a metal stud bump 112 coupled thereto are bonded to contacts 166 on the top packaged die 176 using solder balls 174. The solder joints 182 for these bond pads 102 that do not include a metal stud bump 112 comprise only solder. Advantageously, the metal stud bumps 112 are either placed in the entire perimeter of the PoP device 180 in corner regions 150 or in both corner and central edge regions 150 and 152, so that the PoP device 180 is more robust. The metal stud bumps 112 also provide consistent spacing between the packaged dies 126 and 176 across the surfaces of the packaged dies 126 and 176, e.g., in a vertical direction in the cross-sectional views shown in FIGS. 21 and 22.

In accordance with one embodiment of the present disclosure, a PoP device includes a first packaged die and a second packaged die coupled to the first packaged die. A plurality of metal stud bumps is disposed between the first packaged die and the second packaged die. Each of the plurality of metal stud bumps includes a bump region and a tail region coupled to the bump region. Each of the plurality of metal stud bumps is embedded in a solder joint.

In accordance with another embodiment, a PoP device includes a bottom packaged die comprising a plurality of metal stud bumps disposed on a top surface thereof. Each of the plurality of metal stud bumps includes a bump region and a tail region coupled to the bump region. The PoP device also includes a top packaged die coupled to the bottom packaged die. The top packaged die includes a plurality of contacts formed on a bottom surface thereof. Each of the plurality of metal stud bumps on the bottom packaged die is embedded in a solder joint coupled to one of the plurality of contacts on the top packaged die.

In accordance with yet another embodiment, a method of packaging semiconductor dies includes coupling a first die to a top surface of a first substrate, and coupling a plurality of metal stud bumps to the top surface of the first substrate. Each of the plurality of metal stud bumps includes a bump region and a tail region coupled to the bump region. A second die is coupled to a top surface of a second substrate, and a plurality of solder balls is formed on a bottom surface of the second substrate. A molding compound is formed over the second die on the top surface of the second substrate. The method includes coupling each of the plurality of metal stud bumps on the top surface of the first substrate to one of the plurality of solder balls on the bottom surface of the second substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package-on-package (PoP) device, comprising:
   a first packaged die comprising a first die;
   a second packaged die comprising a second die coupled to the first packaged die; and
   a plurality of metal stud bumps disposed between the first packaged die and the second packaged die, wherein the plurality of metal stud bumps is disposed laterally adjacent to the first die of the first packaged die, and wherein the plurality of metal stud bumps each include a bump region proximal the first package die and a tail region extending from the bump region towards the second packaged die, and wherein each of the plurality of metal stud bumps is embedded in a solder joint disposed between the first packaged die and the second packaged die.

2. The device according to claim 1, wherein the first packaged die comprises the first die disposed over a first substrate, and wherein the second packaged die comprises the second die disposed over a second substrate.

3. The device according to claim 2, wherein the second packaged die comprises a plurality of second dies stacked vertically above the second substrate.

4. The device according to claim 2, wherein the plurality of metal stud bumps is coupled to the first substrate, and wherein each of the plurality of metal stud bumps comprises a height of about 50 to 300 μm and a diameter of about 50 to 200 μm proximate the first substrate.

5. The device according to claim 2, wherein the first substrate or the second substrate comprises a plurality of through substrate vias disposed therein.

6. The device according to claim 1, wherein the plurality of metal stud bumps comprises a material selected from the group consisting essentially of Cu, Al, Au, Pt, Pd, and combinations thereof.

7. A package-on-package (PoP) device, comprising:
   a bottom packaged die comprising a first die and a peripheral region surrounding the first die, the bottom packaged die further comprising a plurality of metal stud bumps disposed in the peripheral region on a top surface thereof, the plurality of metal stud bumps disposed next to the first die, each of the plurality of metal stud bumps including a bump region and a tail region coupled to the bump region, the tail region having a diameter smaller than the bump region; and
   a top packaged die coupled to the bottom packaged die, the top packaged die comprising a plurality of contacts formed on a bottom surface thereof, wherein each of the plurality of metal stud bumps on the bottom packaged die is embedded in a solder joint coupled to one of the plurality of contacts on the top packaged die.

8. The device according to claim 7, further comprising a plurality of solder balls disposed on a bottom surface of the bottom packaged die.

9. The device according to claim 7, wherein each of the plurality of metal stud bumps extends fully to one of the plurality of contacts on the top packaged die.

10. The device according to claim 7, wherein each of the plurality of metal stud bumps extends partially to one of the plurality of contacts on the top packaged die.

11. The device according to claim 7, wherein the bottom packaged die comprises a plurality of bond pads on the top surface thereof, and wherein each of the plurality of metal stud bumps is bonded to a bond pad on the top surface of the bottom packaged die.

12. The device according to claim 11, wherein one of the plurality of metal stud bumps is bonded to each of the plurality of bond pads on the bottom packaged die.

13. The device according to claim 11, wherein one of the plurality of metal stud bumps is bonded to some of the plurality of bond pads on the bottom packaged die.

14. The device according to claim 13, wherein one of the plurality of metal stud bumps is bonded to each of the plurality of bond pads in corner regions of the bottom packaged die.

15. The device according to claim 14, wherein one of the plurality of metal stud bumps is bonded to each of the plurality of bond pads in central edge regions of the bottom packaged die.

16. A method of packaging semiconductor dies, the method comprising:
   coupling a first die to a top surface of a first substrate to form a first packaged die;
   coupling a second die to a top surface of a second substrate to form a second packaged die; and
   forming a plurality of metal stud bumps between the first packaged die and the second packaged die, wherein the plurality of metal stud bumps is coupled to the first packaged die at the top surface of the first substrate, the plurality of metal stud bumps disposed laterally adjacent to the first die, each of the plurality of metal stud bumps including a bump region proximal the first packaged die and a tail region coupled to the bump region, the tail region extending from the bump region towards the second packaged die, wherein each of the plurality of metal stud bumps is embedded in a solder joint disposed between the first packaged die and the second packaged die.

17. The method according to claim 16, wherein coupling the first die to the top surface of the first substrate comprises coupling solder bumps on a bottom surface of the first die to bond pads or traces on the top surface of the first substrate.

18. The method according to claim 16, wherein coupling the second die to the top surface of the second substrate comprises wire-bonding contacts on a top surface of the second die to contact pads on the top surface of the second substrate, wherein the method further comprises coupling a third die over the second die and wire-bonding contacts on a top surface of the third die to the contact pads on the top surface of the second substrate, and wherein forming the molding compound further comprises forming the molding compound over the third die.

19. The method according to claim 16, wherein forming the plurality of metal stud bumps between the first packaged die and the second packaged die comprises providing a wire, forming a ball at an end of the wire, placing the ball against a bond pad on the top surface of the first substrate, ultrasonically vibrating the ball against the bond pad, and heating the first substrate.

20. The method according to claim 16, further comprising: heating the first substrate and the second substrate to reflow a solder material to form the solder joint on the bottom surface of the second substrate.

* * * * *